United States Patent [19]
Uda et al.

[11] Patent Number: 5,945,867
[45] Date of Patent: Aug. 31, 1999

[54] SWITCH CIRCUIT DEVICE

[75] Inventors: Hisanori Uda, Hirakata; Keiichi Honda, Ora, both of Japan

[73] Assignee: Sanyo Electric Co., Ltd., Moriguchi, Japan

[21] Appl. No.: 09/027,716

[22] Filed: Feb. 23, 1998

[30] Foreign Application Priority Data

Feb. 24, 1997 [JP] Japan .................................. 9-039598

[51] Int. Cl.$^6$ ................................................ H03K 17/687
[52] U.S. Cl. .................... 327/431; 327/430; 327/389; 327/408; 327/404; 333/103; 333/104
[58] Field of Search .................................. 327/407, 408, 327/389, 404, 427, 434, 430, 431; 333/103, 104, 262

[56] References Cited

U.S. PATENT DOCUMENTS

| 5,061,911 | 10/1991 | Weidman et al. | 333/104 |
|---|---|---|---|
| 5,081,706 | 1/1992 | Kim | 333/104 |
| 5,159,297 | 10/1992 | Tateno | 333/104 |
| 5,272,457 | 12/1993 | Heckaman et al. | 333/262 |
| 5,477,184 | 12/1995 | Uda et al. | 327/404 |
| 5,497,118 | 3/1996 | Ueno et al. | 327/431 |
| 5,856,713 | 1/1999 | Huettner et al. | 333/103 |

FOREIGN PATENT DOCUMENTS

| 0 372 984 A2 | 6/1990 | European Pat. Off. . |
|---|---|---|
| 8-139014 | 5/1996 | Japan . |

OTHER PUBLICATIONS

Hisanori Uda et al: "High–Performance GaAs Switch IC's Fabricated Using MESFET's With Two Kinds of Pinch–Off Voltages and a Symmetrical Pattern Configuration" IEEE Journal of Solid–State Circuits, vol. 29, No. 10, Oct. 1, 1994, pp. 1262–1269, XP000445356.

Shifrin M et al: "Monolithic Control Components Handle 27 W of RF Power" Microwave Journal, vol. 32, No. 12, Dec. 1, 1989, pp. 119–122, XP000116633.

H. Uda et al., IEEE Transaction on Components, Packaging, and Manufacturing Technoly–Part B, vol. 19, No. 1, pp. 182–197; Feb. 1996, "Development of Ultra–Compact Plastic–Packed High–Isolation GaAs SPDT Switch".

H. Uda et al, IEEE 1996 Microwave and Millimeter–Wave Monolithic Circuits Sumposium; VIII–3, pp. 159–162, "A High–Performance and Miniaturized Dual–Use (Antenna/Local) GaAs SPDT Switch IC Operating at +3V/OV".

P. O'Sullivan et al; IEEE GaAs IC Symposium; pp. 33–35; 1993, "High Performance Integrated PA, T/R Switch For 1.9 GHz Personal Communications Handsets".

K. Miyatsuji et al; IEICE Trans. Electron., vol. E78–C; No. 8, pp. 931–935; Aug. 1995, "A GaAs Single Voltage Controlled RF Switch IC".

K. Kohama et al; IEEE Journal of Solid–State Circuits, vol. 31, No. 10, pp. 1406–1411, Oct. 1996, "High Power DPDT Antenna Switch MMIC for Digital Cellular Systems".

K. Kawakyu et al; 1996 IEEE MTT–S Digest, pp. 647–650, "A novel Resonant–Type GaAs SPDT Switch IC With Low Distortion Characteristics for 1.9 GHz Personal Handy–Phone System".

*Primary Examiner*—Timothy P. Callahan
*Assistant Examiner*—Jung Ho Kim
*Attorney, Agent, or Firm*—Armstrong, Westerman, Hattori, Mcleland & Naughton

[57] ABSTRACT

A first FET is connected between first and third nodes, a second FET is connected between second and fourth nodes, a third FET is connected between third and fifth nodes and a fourth FET is connected between fourth and fifth nodes. A fifth FET is connected between first and sixth nodes and a sixth FET is connected between second and sixth nodes. The gates of the first, fourth and sixth FETs are connected to a first control terminal and the gates of the second, third and fifth FETs are connected to a second control terminal. A power-supply terminal is connected to the fifth and sixth nodes. The first and second nodes are connected to a common terminal through first and second capacitors, respectively. The fifth and sixth FETs form a pull-up switching circuit. The pull-up switching circuit pulls up the source of an FET in an OFF state to the power-supply voltage and isolates the source of an FET in an ON state from the power-supply voltage.

17 Claims, 14 Drawing Sheets

5,945,867

SWITCH CIRCUIT DEVICE

BACKGROUND OF THE INVENTION

1. Field of the Invention

The present invention relates to a switch circuit device formed of a plurality of field-effect transistors (FETs).

2. Description of the Background Art

For example, GaAs-system switch circuit devices capable of high-speed switching operation are used in transmitter/receiver devices for microwave communication systems. FIG. 9 is a circuit diagram showing an example of a conventional switch circuit device using MESFETs (Metal-Semiconductor Field-Effect Transistors, referred to simply as FETs hereinafter).

The switch circuit device shown in FIG. 9 includes an FET 100 connected between a node Ni connected to a terminal A and a node N3 connected to a terminal B, and an FET 200 connected between a node N2 connected to the terminal A and a node N4 connected to a terminal C. It also includes an FET 300 connected between the node N3 and ground potential and an FET 400 connected between the node N4 and ground potential.

The FETs 100 and 400 have their respective gates connected to a control terminal D through respective resistances and the FETs 200 and 300 have their respective gates connected to a control terminal E through respective resistances. Control voltages V1 and V2 complementary to each other are applied to the control terminals D and E, respectively.

The terminal A is supplied with a high-frequency signal RX0, the terminal B is supplied with a high-frequency signal RX1, and the terminal C is supplied with a high-frequency signal RX2.

FIG. 10 is a diagram showing an example of drain current (Id) versus source-drain voltage (Vds) characteristics of an FET.

For example, when the gate voltage Vgs is 0 V, the drain current Id is about 0.15 [A/mm]. When the gate voltage Vgs is deeper than −1.0 V, the drain current Id is approximately zero. Accordingly, for example, the FET turns on when the gate voltage Vgs is 0 V, and it turns off when the gate voltage Vgs is −3.0 V.

In the switch circuit device shown in FIG. 9, for example, when the control voltage V1 is −3.0 V and the control voltage V2 is 0 V, the FETs 200 and 300 turn on and the FETs 100 and 400 turn off. This allows signal transmission between the terminals A and C. These voltages in operation and the states of the FETs are shown in the parentheses.

On the other hand, when the control voltage V1 is 0 V and the control voltage V2 is −3.0 V, the FETs 100 and 400 turn on and the FETs 200 and 300 turn off. This allows signal transmission between the terminals A and B.

In a conventional switch circuit device using FETs, the transmission path is switched by utilizing the linear region with the gate voltage Vgs of 0 V (ON state) in the drain current (Id) versus source-drain voltage (Vds) characteristics and the state with application of the gate voltage Vgs at or below the pinch-off voltage (OFF state).

However, as shown in FIG. 11, a gate voltage Vgs exceeding zero can be applied to the FET until a forward current flows to the gate (in FIG. 11, Vgs=0.5 V). If this state can be utilized as the ON state, it is possible to pass larger current than in the case of Vgs=0 and to reduce the inclination of the linear region (ON resistance Ron), so as to realize high power-handling capability and low insertion loss.

The conventional switch circuit device shown in FIG. 9 requires a negative power-supply circuit because it needs application of negative control voltage to turn on and off the FETs 100, 200, 300, and 400. This hinders size reduction of the switch circuit device.

When the switch circuit device is operated by using positive control voltage, it is necessary to pull up FETs in the switch circuit device with a positive voltage. Methods for pulling up an FET with positive voltage include a method in which an FET is pulled up by using a power-supply voltage and a method in which an FET is pulled up without using a power-supply voltage.

FIG. 12 is a circuit diagram showing a switch circuit device in which FETs are pulled up by using power-supply voltage.

The switch circuit device shown in FIG. 12 includes an FET 1 connected between the nodes N1 and N3, an FET 2 connected between the nodes N2 and N4, an FET 3 connected between the nodes N3 and N5, and an FET 4 connected between the nodes N4 and N5. The FETs 1 and 4 have their respective gates connected to a control terminal D through respective resistances and the FETs 2 and 3 have their respective gates connected to a control terminal E through respective resistances.

The FETs 1 to 4 have the characteristics shown in FIG. 11. The terminal A and the node N5 are connected to a power-supply terminal F through resistances. A power-supply voltage Vdd of +3.0 V is applied to the power-supply terminal F.

For example, when the control voltage V1 is 0 V and the control voltage V2 is +3.0 V, the FETs 2 and 3 turn on and the FETs 1 and 4 turn off. At this time, the nodes N1, N2 and N5 are pulled up to +3.0 V directly from the power-supply terminal F, the node N3 is pulled up to +3.0 V through the FET 3, and the node N4 is pulled up to +3.0 V through the FET 2. These voltages in operation and the states of the FETs are shown in the parentheses.

In this case, however, the gate voltage Vgs at the transistors 2 and 3 in the ON state is 0 V, therefore the gate voltage Vgs cannot be applied positively. Accordingly, a large current cannot be passed through the FETs. That is to say, the FETs 1 to 4 cannot exhibit their capability of allowing application of positive gate voltage Vgs.

FIG. 13 is a circuit diagram showing a switch circuit device in which FETs are pulled up without using power-supply voltage.

In the switch circuit device shown in FIG. 13, too, the FET 1 is connected between the nodes N1 and N3, the FET 2 is connected between the nodes N2 and N4, the FET 3 is connected between the nodes N3 and N5, and the FET 4 is connected between the nodes N4 and N5. The FETs 1 and 4 have their respective gates connected to the control terminal D through respective resistances and the FETs 2 and 3 have their respective gates connected to the control terminal E through respective resistances. These FETs 1 to 4 have the characteristics shown in FIG. 11.

For example, when the control voltage V1 is 0 V and the control voltage V2 is +3.0 V, the FETs 2 and 3 turn on and the FETs 1 and 4 turn off. At this time, the forward current transiently flowing to the FETs 2 and 3 due to the +3.0 V control voltage V2 charges external capacitances C0, C1, C2 and a capacitance 13. Hence, the voltages at the nodes N1, N2, N3, N4 and N5 become lower by the built-in voltage of the FETs down to +2.5 V. These voltages in operation and the states of the FETs are shown in the parentheses.

In this case, a gate voltage Vgs at +0.5 V is applied to the FETs 2 and 3 in the ON state, and a large drain current can be passed. That is to say, the switch circuit device shown in FIG. 13 can effectively utilize the capability of the FETs 1 to 4 of allowing application of a large positive gate voltage Vgs. As a result, the switch circuit device shown in FIG. 13 can provide lower insertion loss than the switch circuit device shown in FIG. 12.

However, the switch circuit device shown in FIG. 13 raises the following problem. The gate voltage Vgs applied to the FETs 1 and 4 in the OFF state is −2.5 V. If the pinch-off voltage Vp of the FETs 1 to 4 is −1.0 V, the difference between the gate voltage Vgs at the OFF-state FETs 1 and 4 and the pinch-off voltage is 1.5 V. The difference between the gate voltage Vgs at an FET in an OFF state and the pinch-off voltage Vp determines the withstand voltage characteristic.

In the switch circuit device shown in FIG. 12, the gate voltage Vgs at the FETs 1, 4 in the OFF state is −3.0 V. In this case, the difference between the gate voltage Vgs at the OFF-state FETs 1, 4 and the pinch-off voltage Vp is 2 V.

This way, in the switch circuit device shown in FIG. 13, FETs in the OFF state present an inferior withstand voltage characteristic to those in the switch circuit device shown in FIG. 12. Hence, it is prone to signal leakage and presents an input/output power characteristic with deteriorated linearity.

FIG. 14 is a circuit diagram showing another example of a conventional switch circuit device. In the switch circuit device shown in FIG. 14, five FETs 11 to 15 are connected in series between the terminals A and B and five FETs 21 to 25 are connected in series between the terminals A and C. The FETs 11 to 15 have their respective gates connected to the control terminal D through respective resistances and the FETs 21 to 25 have their respective gates connected to the control terminal E through respective resistances. Mutually complementary control voltages V1 and V2 are applied to the control terminals D and E.

In the switch circuit device shown in FIG. 14, if the control voltage V1 is +3.0 V and the control voltage V2 is 0 V, the FETs 11 to 15 turn on and the FETs 21 to 25 turn off. This allows signal transmission between the terminals A and B.

In this case, the voltage between the terminals A and C is distributed among the five FETs 21 to 25. Then, when signal is transmitted between the terminals A and B, signal leakage is less liable to occur between the terminals A and C. Further, it is possible to reduce the size of each FET to improve the yield.

However, actually, in the FETs 21 to 25 in the OFF state, the voltage applied between the gate and source of the FET 21 placed on one end and the voltage applied between the gate and drain of the FET 25 placed on the other end are larger than the value in the case of equal distribution. Then, when large power signal is transmitted between the terminals A and B, signal leakage is apt to occur between the terminals A and C.

SUMMARY OF THE INVENTION

An object of the present invention is to provide a switch circuit device that allows passage of a large current in an ON state and that prevents signal leakage in an OFF state.

Another object of the present invention is to provide a switch circuit device enabling size reduction and price reduction, and presenting an improved input/output power characteristic.

A switch circuit device according to the present invention that complementarily switches a path between a common terminal and a first terminal and a path between the common terminal and a second terminal between an ON state and an OFF state comprises: one or a plurality of first field-effect transistors connected in one stage or in a plurality of stages between a first node connected to the common terminal and the first terminal, and each having a gate electrode receiving a first control voltage, one electrode on the side of the first node and the other electrode on the side of the first terminal; one or a plurality of second field-effect transistors connected in one stage or in a plurality of stages between a second node connected to the common terminal and the second terminal, and each having a gate electrode receiving a second control voltage complementary to the first control voltage, one electrode on the side of the second node and the other electrode on the side of the second terminal; and a switching circuit for applying a given pull-up voltage to one of the first and second nodes that is connected to a field-effect transistor in an OFF state and isolating from the pull-up voltage one of the first and second nodes that is connected to a field-effect transistor in an ON state.

In the switch circuit device according to the present invention, a pull-up voltage is applied to one of the first and second nodes that is connected to the field-effect transistor that is in an OFF state. Then the one electrode, on the common terminal side, of each OFF-state field-effect transistor is pulled-up to the pull-up voltage and the gate voltage at each OFF-state field-effect transistor is lowered. This makes the withstand voltage characteristic of each OFF-state field-effect transistor higher, which prevents leakage of signals. This allows reduction in the number of stages of the first and second field-effect transistors, improving yield of the switch circuit devices and enabling size reduction and price reduction. As compared with a conventional switch circuit device having the same number of stages of field-effect transistors, the input/output power characteristic is improved.

On the other hand, one of the first and second nodes that is connected to the field-effect transistor in the drain current (Id) versus source-drain voltage (Vds) characteristics in an ON state is isolated from the pull-up voltage. Then the one electrode, on the common terminal side, of each ON-state field-effect transistor is isolated from the pull-up voltage, and the voltage becomes lower than the voltage at the gate electrode by the built-in voltage. This lowers resistance of each ON-state field-effect transistor, thus providing lower insertion loss. Since it is possible to pass large current to each ON-state field-effect transistor, the gate width can be reduced. This improves the yield of the switch circuit devices and enables size reduction and price reduction.

The switching circuit may include at least one third field-effect transistor connected between the first node and a first common node receiving the pull-up voltage and having a gate electrode receiving the second control voltage, and at least one fourth field-effect transistor connected between the second node and the first common node and having a gate electrode receiving the first control voltage.

In this case, when each first field-effect transistor turns off and each second field-effect transistor turns on, the third field-effect transistor turns on and the fourth field-effect transistor turns off. Then the first common node receiving the pull-up voltage is connected to the first node and is cut off from the second node.

On the other hand, when each first field-effect transistor turns on and each second field-effect transistor turns off, the third field-effect transistor turns off and the fourth field-effect transistor turns on. Then the first common node receiving the pull-up voltage is connected to the second node and is cut off from the first node.

Thus, one electrode on the common terminal side of each first or second field-effect transistor in the OFF state is pulled up to the pull-up voltage and one electrode on the common terminal side of each field-effect transistor in the ON state is not pulled up to the pull-up voltage.

The first node may be connected to the common terminal in an AC manner and the second node may be connected to the common terminal in an AC manner. The switching circuit may further include a first capacitor interposed between the common terminal and the first node, and a second capacitor interposed between the common terminal and the second node. This prevents current from flowing to the common terminal side due to the pull-up voltage.

The switch circuit device may further include one or a plurality of fifth field-effect transistors connected in one stage or in a plurality of stages between the first terminal and a ground potential and each having a gate electrode receiving the second control voltage, one electrode on the side of the ground potential and the other electrode on the side of the first terminal, and one or a plurality of sixth field-effect transistors connected in one stage or in a plurality of stages between the second terminal and the ground potential and each having a gate electrode receiving the first control voltage, one electrode on the side of the ground potential and the other electrode on the side of the second terminal.

In this case, when each first field-effect transistor turns off and each second field-effect transistor turns on, each fifth field-effect transistor turns on and each sixth field-effect transistor turns off. Then the other electrode of each first field-effect transistor is connected to the ground potential.

When each first field-effect transistor turns on and each second field-effect transistor turns off, each fifth field-effect transistor turns off and each sixth field-effect transistor turns on. Then the other electrode of each second field-effect transistor is connected to the ground potential.

Thus, the other electrode of each first or second field-effect transistor in the OFF state is connected to the ground potential, which sufficiently prevents signal leakage and improves isolation.

The one or plurality of fifth field-effect transistors may be connected between the first terminal and a second common node, and the one or plurality of sixth field-effect transistors may be connected between the second terminal and the second common node, and the second common node may be connected to the ground potential in an AC manner and may receive the pull-up voltage. The switch circuit device may further include a third capacitor connected between the second common node and the ground potential. In this case, the current originated from the pull-up voltage is prevented from flowing to the ground potential side.

The first and second control voltages complementarily change to the ground potential and a positive potential and the pull-up voltage is kept at a positive potential. Then the switch circuit device can operate with a positive power-supply circuit, without the need for a negative power-supply circuit. This allows size reduction of the switch circuit device.

The positive potential of the first and second control voltages may be approximately equal to the positive potential of the pull-up voltage. Then it is possible to produce the first and second control voltages and the pull-up voltage with a common power-supply voltage.

The one or plurality of first field-effect transistors may include a plurality of first field-effect transistors, and the one or plurality of second field-effect transistors may include a plurality of second field-effect transistors, and the switch circuit device may further include a plurality of first resistances each connected between the one electrode and the other electrode of a corresponding one of the plurality of first field-effect transistors, and a plurality of second resistances each connected between the one electrode and the other electrode of a corresponding one of the plurality of second field-effect transistors.

In this case, one electrode and the other electrode of each first or second field-effect transistor in the OFF state are at equal potential. Hence the voltage applied between the common terminal and the first or second terminal is equally distributed among the plurality of field-effect transistors in the OFF state.

This improves the withstand voltage characteristic of the field-effect transistors in the OFF state, allowing reduction in the number of stages of the first and second field-effect transistors. This improves the yield of the switch circuit devices and enables size reduction and price reduction. As compared with a conventional switch circuit device having the same number of stages of field-effect transistors, the input/output power characteristic is improved.

The one or plurality of fifth field-effect transistors may include a plurality of fifth field-effect transistors, and the one or plurality of sixth field-effect transistors may include a plurality of sixth field-effect transistors, and the switch circuit device may further include a plurality of third resistances each connected between the one electrode and the other electrode of a corresponding one of the plurality of fifth field-effect transistors, and a plurality of fourth resistances each connected between the one electrode and the other electrode of a corresponding one of the plurality of sixth field-effect transistors.

In this case, one electrode and the other electrode of each fifth or sixth field-effect transistor in the OFF state are at equal potential. Hence the voltage applied between the first or second terminal and the ground potential is equally distributed among the plurality of field-effect transistors in the OFF state.

This improves the withstand voltage characteristic of the field-effect transistors in the OFF state, allowing reduction in the number of stages of the fifth and sixth field-effect transistors. This improves the yield of the switch circuit devices and enables size reduction and price reduction. As compared with a conventional switch circuit device having the same number of stages of field-effect transistors, the input/output power characteristic is improved.

The one or plurality of first field-effect transistors and the one or plurality of second field-effect transistors may be metal semiconductor field-effect transistors. The one or plurality of third field-effect transistors and the one or plurality of fourth field-effect transistors may be metal semiconductor field-effect transistors. Further, the one or plurality of fifth field-effect transistors and the one or plurality of sixth field-effect transistors may be metal semiconductor field-effect transistors.

A switch circuit device according to another aspect of the present invention that complementarily switches a path between a common terminal and a first terminal and a path between the common terminal and a second terminal between an ON state and an OFF state includes: a plurality of first field-effect transistors connected in a plurality of stages between the common terminal and the first terminal, and each having a gate electrode receiving a first control voltage, one electrode on the side of the common terminal, and the other electrode on the side of the first terminal; a plurality of second field-effect transistors connected in a plurality of stages between the common terminal and the second terminal, and each having a gate electrode receiving a second control voltage complementary to the first control voltage, one electrode on the side of the common terminal, and the other electrode on the side of the second terminal; a plurality of first resistances each connected between the one electrode and the other electrode of a corresponding one of the plurality of first field-effect transistors; and a plurality of second resistances each connected between the one electrode and the other electrode of a corresponding one of the plurality of second field-effect transistors.

In this switch circuit device, since a resistance is connected between one electrode and the other electrode of a corresponding one of the first and second field-effect transistors connected in a plurality of stages, the one electrode and the other electrode of each field-effect transistor in the OFF state are at equal potential. The voltage applied between the common terminal and the first or second terminal is therefore equally distributed among the plurality of OFF-state field-effect transistors.

This improves the withstand voltage characteristic of the field-effect transistors in the OFF state, allowing reduction in the number of stages of the first and second field-effect transistors. This improves the yield of the switch circuit devices and enables size reduction and price reduction. As compared with a conventional switch circuit device having the same number of stages of field-effect transistors, the input/output power characteristic is improved.

The first and second control voltages may change complementarily to a ground potential and a positive potential. The plurality of first field-effect transistors and the plurality of second field-effect transistors may be metal semiconductor field-effect transistors.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
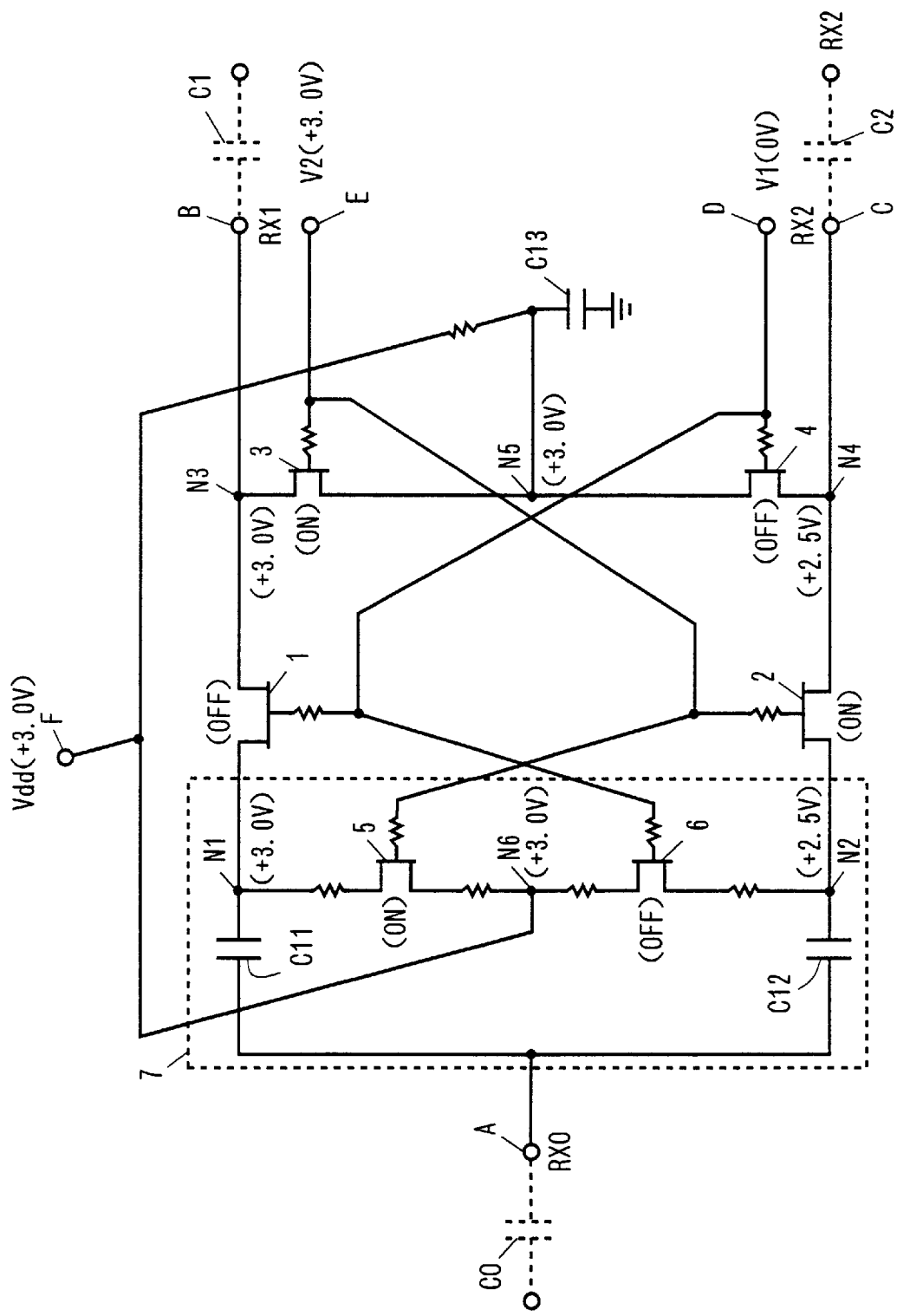
FIG. 1 is a circuit diagram of a switch circuit device in a first embodiment of the present invention.

FIG. 1 is a circuit diagram showing a switch circuit device in a first embodiment of the present invention.

The switch circuit device shown in FIG. 1 has terminals A, B, C, control terminals D, E, and a power-supply terminal F. The terminals A, B, and C are supplied with high-frequency signals RX0, RX1, and RX2, respectively. The control terminals D and E are supplied with mutually complementary control voltages V1 and V2, respectively. In this embodiment, the control voltages V1 and V2 are +3.0 V or 0 V. The power-supply terminal F is supplied with a power-supply voltage Vdd. In this embodiment, the power-supply voltage Vdd is +3.0 V. External capacitances C0, C1, and C2 are connected to the terminals A, B, and C, respectively.

Figure 11:
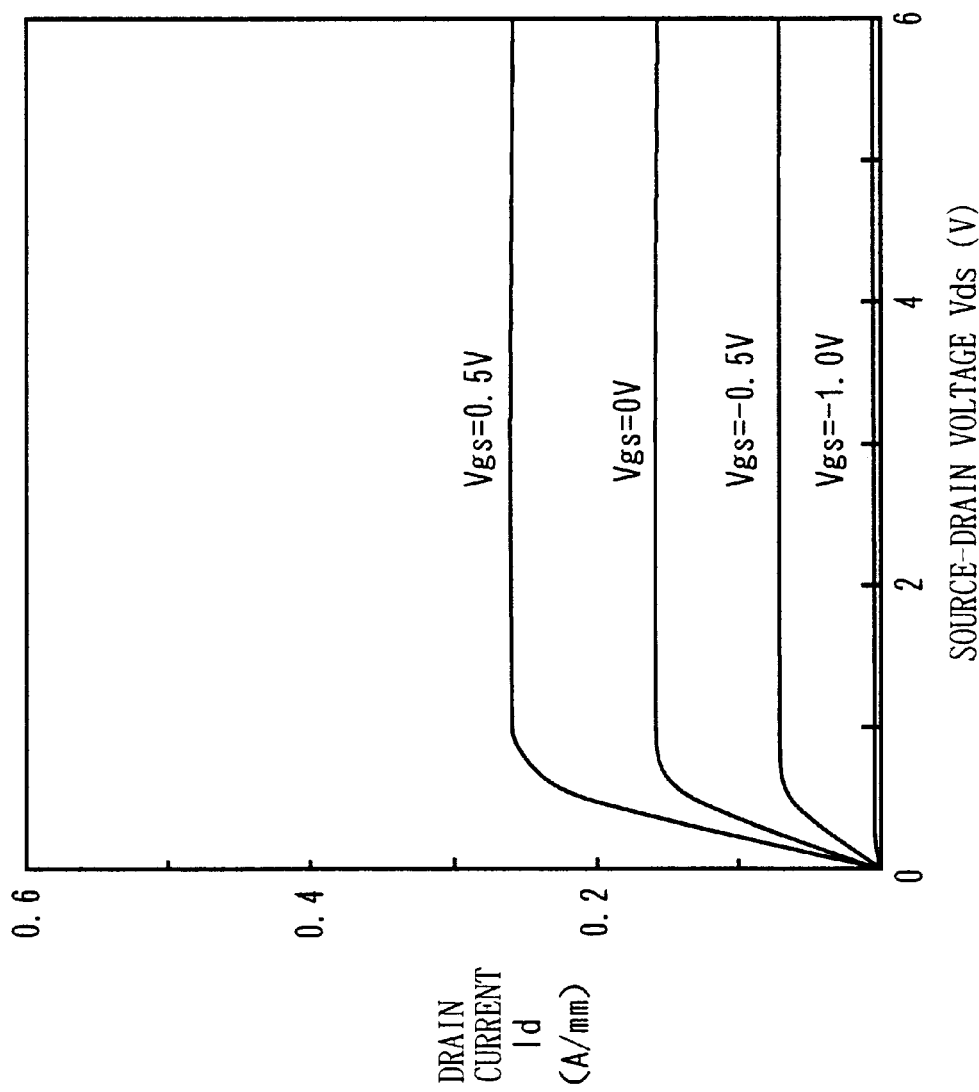
FIG. 11 is a diagram showing another example of drain current versus source-drain voltage characteristics of an FET.

An FET 1 is connected between nodes N1 and N3, an FET 2 is connected between nodes N2 and N4, an FET 3 is connected between nodes N3 and N5, and an FET 4 is connected between nodes N4 and N5. The FETs 1 and 4 have their respective gates connected to the control terminal D through respective resistances and the FETs 2 and 3 have their respective gates connected to the control terminal E through respective resistances. These FETs 1 to 4 have the drain current (Id) versus source-drain voltage (Vds) characteristics shown in FIG. 11. The nodes N3 and N4 are connected to the terminals B and C, respectively. The node N5 is grounded through a capacitance C13.

The switch circuit device of this embodiment has a pull-up switching circuit 7. The pull-up switching circuit 7 includes FETs 5 and 6 and capacitors C11 and C12. The capacitor C11 is connected between the terminal A and the node N1, and the capacitor C12 is connected between the terminal A and the node N2. The FET 5 has its source and its drain respectively connected to the node N1 and the node N6 through resistances, and the FET 6 has its source and its drain respectively connected to the node N2 and the node N6 through resistances.

The FET 5 has its gate connected to the control terminal E through a resistance and the FET 6 has its gate connected to the control terminal D through a resistance. The power-supply terminal F is connected to the node N6, and also to the node N5 through a resistance.

For example, when the control voltage V1 is 0 V and the control voltage V2 is +3.0 V, the FETs 2 and 3 turn on and the FETs 1 and 4 turn off. At the same time, the FET 5 turns on and the FET 6 turns off. Then the node N1 is pulled up to +3.0 V from the power-supply terminal F through the node N6 and the FET 5 and the node N3 is pulled up to +3.0 V from the power-supply terminal F through the node N5 and the FET 3.

The nodes N2 and N4 are charged with a forward current transiently flowing through the FET 2 due to the control voltage V2. The voltages at the nodes N2 and N4 is +2.5 V, which corresponds to the +3.0 V control voltage V2 lowered by the built-in voltage of the FET 2. These voltages in operation and the states of the FETs are shown in the parentheses.

In this case, the gate voltage Vgs at the FETs 2 and 3 in the ON state is +0.5 V, allowing passage of a large drain current. The gate voltage Vgs at the FETs 1 and 4 in the OFF state is −3.0 V. Accordingly, if the pinch-off voltage Vp of the FETs is −1.0 V, the difference between the gate voltage Vgs at the OFF-state FETs 1 and 4 and the pinch-off voltage Vp is 2.0 V, thus providing a high withstand voltage characteristic. As a result, no signal leakage is caused between the terminals A and B even if large power signal is transferred between the terminals A and C. At this time, the node N3 is grounded, which improves the isolation.

On the other hand, when the control voltage V1 is +3.0 V and the control voltage V2 is 0 V, the FETs 1 and 4 turn on and the FETs 2 and 3 turn off. At the same time, the FET 5 turns off and the FET 6 turns on. In this case, the gate voltage Vgs at the FETs 1 and 4 in the ON state is +0.5 V and the gate voltage Vgs at the FETs 2 and 3 in the OFF state is −3.0 V. As a result, even if large power is transferred between the terminals A and B, no signal leakage occurs between the terminals A and C. At this time, the node N4 is grounded, which improves the isolation.

Figure 2:
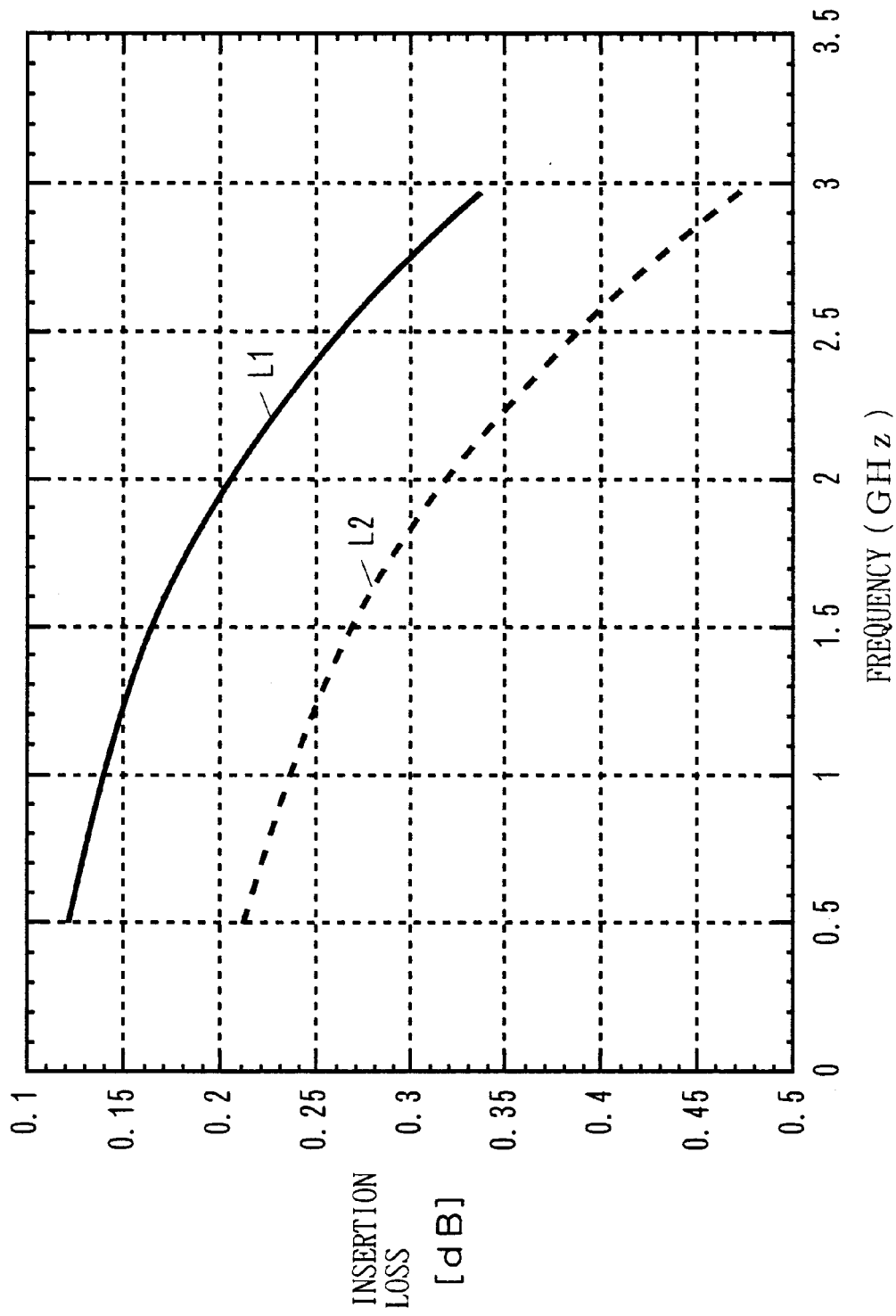
FIG. 2 is a diagram showing results of simulation for frequency dependence of insertion loss in the switch circuit device in FIG. 1 and the switch circuit device in FIG. 12.
Figure 12:
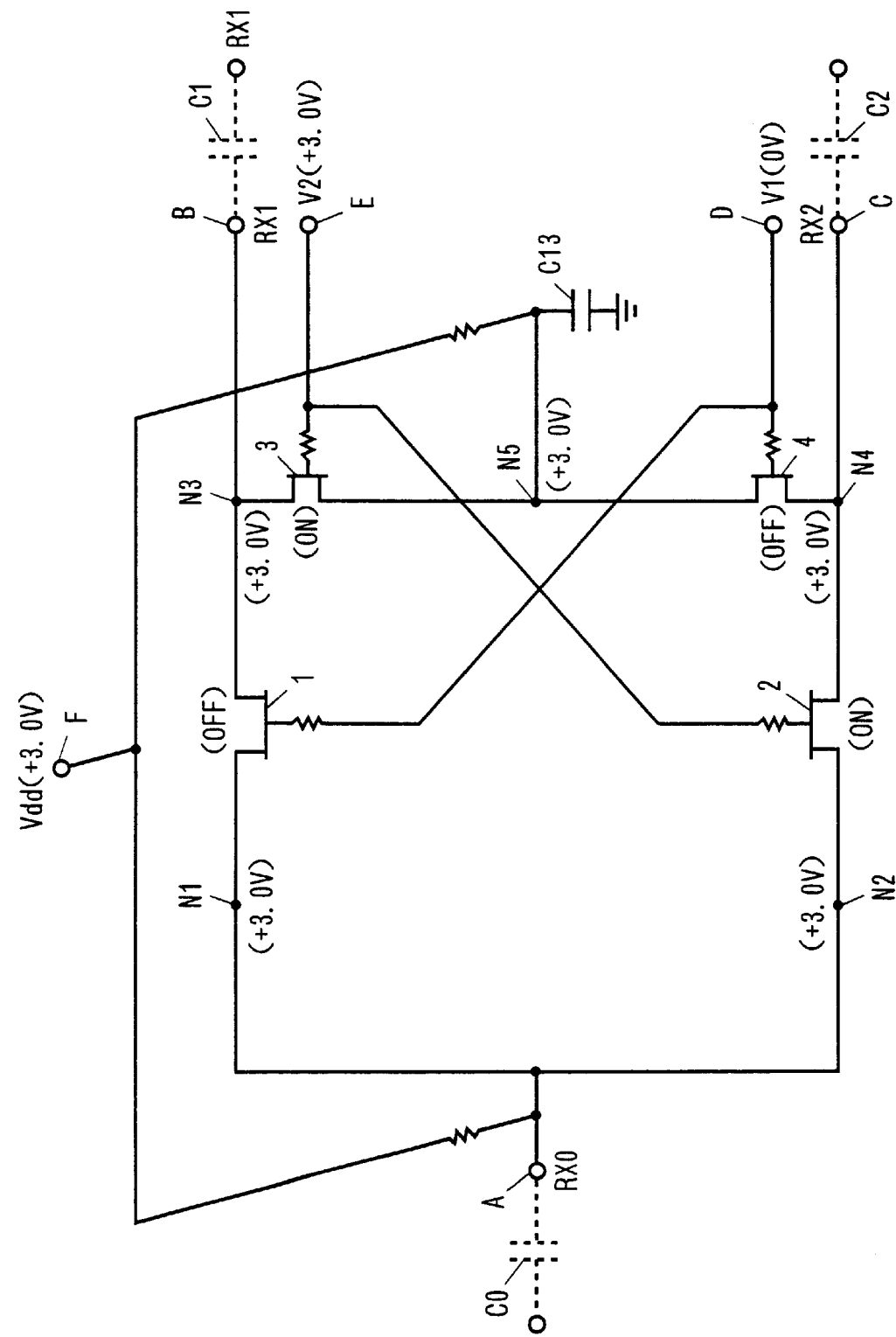
FIG. 12 is a circuit diagram showing a switch circuit device that pulls up FETs by using power-supply voltage.

FIG. 2 shows results of simulation for frequency dependence of insertion loss in the switch circuit device shown in FIG. 1 and in the conventional switch circuit device shown in FIG. 12. In FIG. 2, the solid line L1 shows the insertion loss in the switch circuit device shown in FIG. 1 and the broken line L2 shows the insertion loss in the switch circuit device shown in FIG. 12. As shown in FIG. 2, in the switch circuit device shown in FIG. 1, the insertion loss is lower in a large frequency region than in the switch circuit device shown in FIG. 12.

Figure 3:
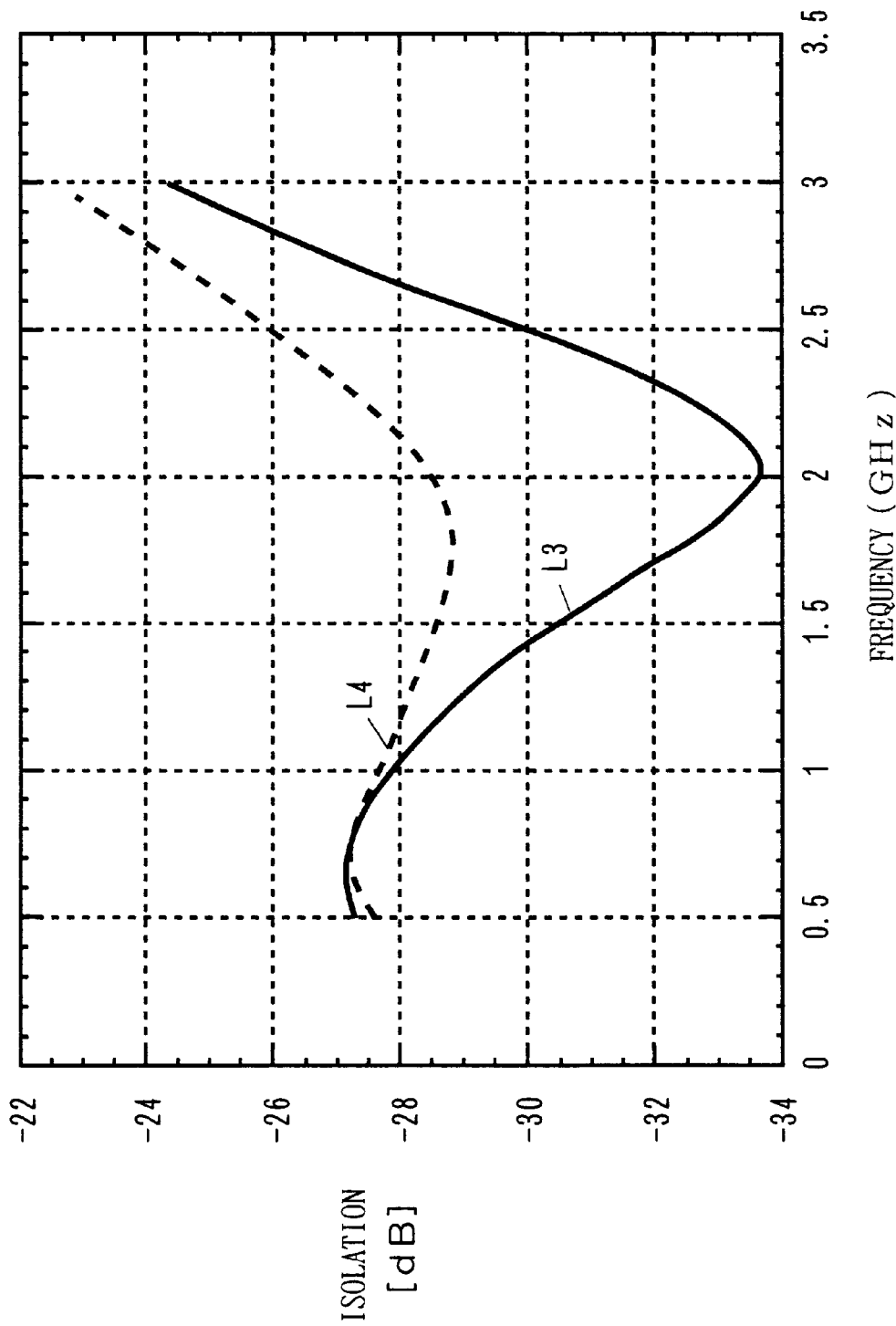
FIG. 3 is a diagram showing results of simulation for frequency dependence of isolation in the switch circuit device in FIG. 1 and the switch circuit device in FIG. 12.

FIG. 3 shows results of simulation for frequency dependence of isolation in the switch circuit device shown in FIG. 1 and the switch circuit device shown in FIG. 12. In FIG. 3, the solid line L3 shows the isolation in the switch circuit device in FIG. 1 and the broken line L4 shows the isolation in the switch circuit device in FIG. 12. As shown in FIG. 3, in the switch circuit device shown in FIG. 1. the isolation is high in the frequency region of 1 GHz or higher.

The switch circuit device in FIG. 1 and the switch circuit device shown in FIG. 12 presented almost the same input/output power characteristics.

Figure 4:
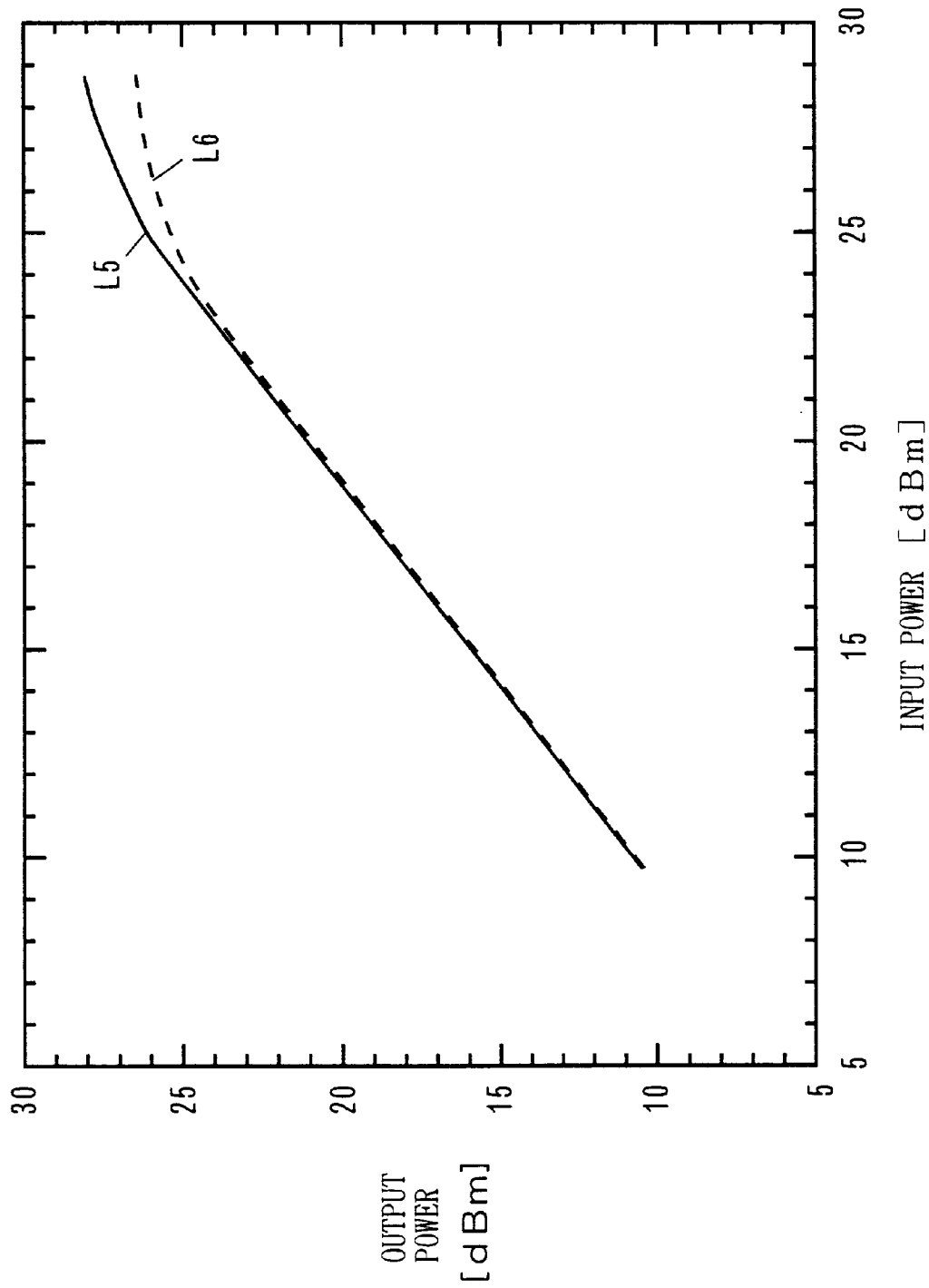
FIG. 4 is a diagram showing results of simulation for input/output power characteristic in the switch circuit device in FIG. 1 and the switch circuit device in FIG. 13.
Figure 13:
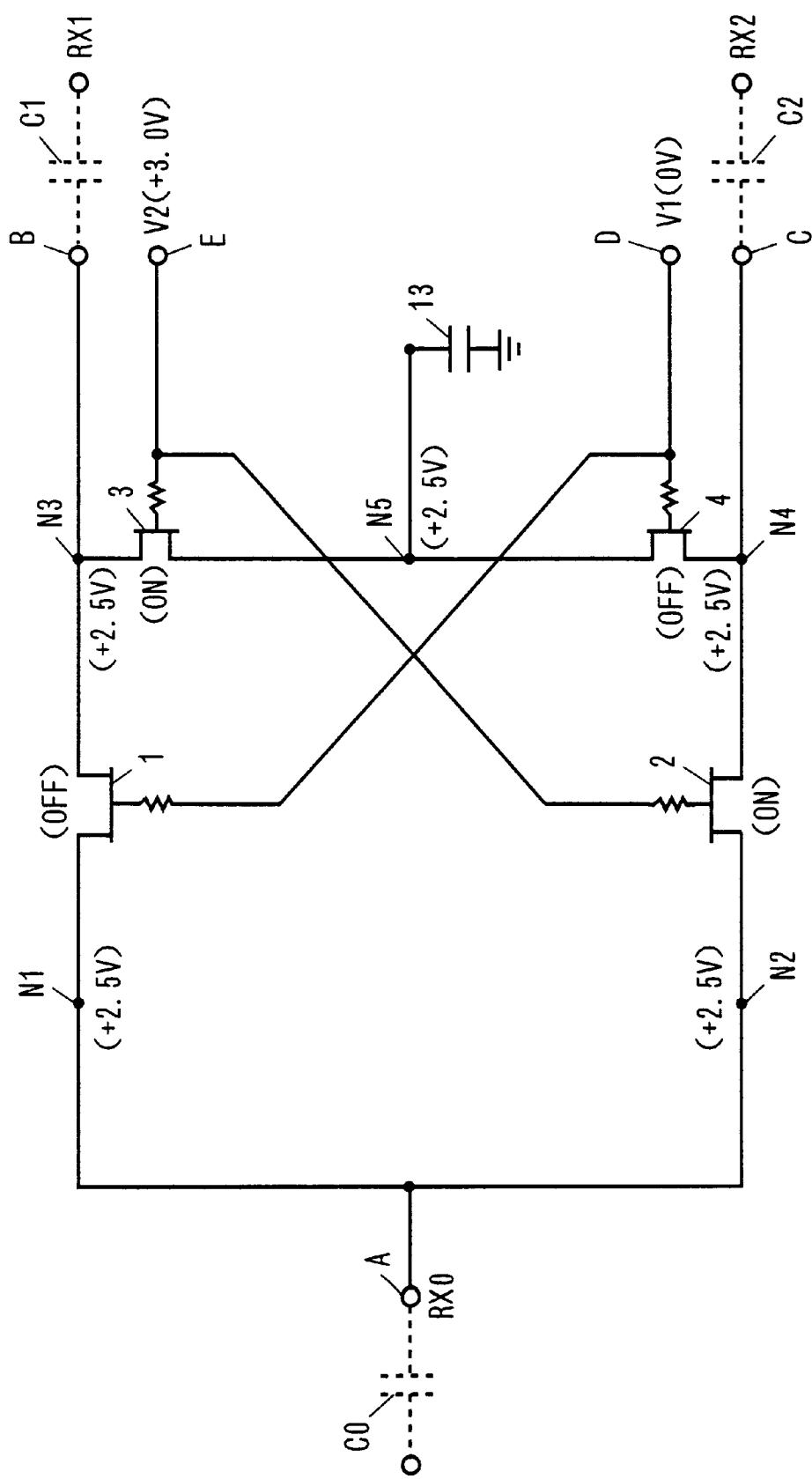
FIG. 13 is a circuit diagram showing a switch circuit device that pulls up FETs without using power-supply voltage.

FIG. 4 shows results of simulation for input/output power characteristic of the switch circuit device shown in FIG. 1 and the conventional switch circuit device shown in FIG. 13. In FIG. 4, the solid line L5 shows the input/output power characteristic of the switch circuit device in FIG. 1 and the broken line L6 shows the input/output power characteristic of the switch circuit device in FIG. 13. As shown in FIG. 4, in the switch circuit device of this embodiment shown in FIG. 1, the linearity is maintained even at input powers exceeding 22 dBm.

The switch circuit device in FIG. 1 and the switch circuit device in FIG. 13 presented almost the same insertion loss and isolation.

From the results shown above, in a comparison between the switch circuit device of the embodiment shown in FIG. 1 and the conventional switch circuit device in FIG. 12, the switch circuit device in FIG. 1 has superior insertion loss and isolation and the two switch circuit devices have almost the same input/output power characteristics. In a comparison between the switch circuit device in FIG. 1 and the conventional switch circuit device shown in FIG. 13, the switch circuit device in FIG. 1 has a superior input/output power characteristic and the two switch circuit devices have almost the same insertion loss and isolation.

Thus, the switch circuit device of this embodiment provides high insertion loss and isolation and an improved input/output power characteristic.

Figure 5:
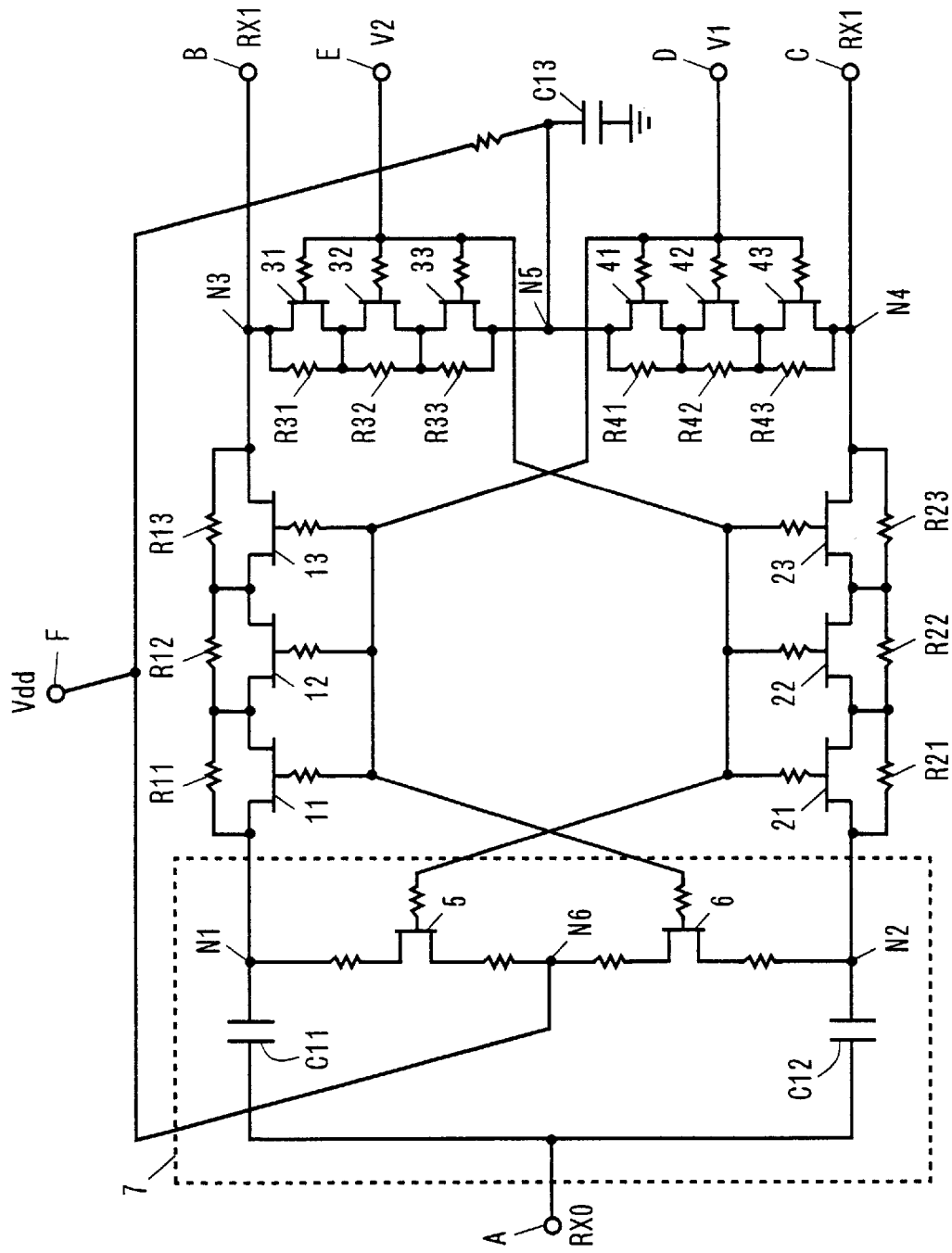
FIG. 5 is a circuit diagram showing a switch circuit device in a second embodiment of the present invention.

FIG. 5 is a circuit diagram showing a switch circuit device in a second embodiment of the present invention.

In the switch circuit device shown in FIG. 5, three FETs 11, 12, 13 are connected in series between the nodes N1 and N3, and three FETs 21, 22, 23 are connected in series between the nodes N2 and N4. Three FETs 31, 32, 33 are connected in series between the nodes N3 and N5 and three FETs 41, 42, 43 are connected in series between the nodes N4 and N5.

The gates of the FETs 11, 12, 13, and 41, 42, 43 are connected to the control terminal D through respective resistances, and the gates of the FETs 21, 22, 23, and 31, 32, 33 are connected to the control germinal E through respective resistances. These FETs 11 to 13, 21 to 23, 31 to 33, 41 to 43 have the drain current (Id) versus source-drain voltage (Vds) characteristics shown in FIG. 11.

Resistances R11, R12, R13 are connected between the sources and drains of the FETs 11, 12, 13, respectively, and resistances R21, R22, R23 are connected between the sources and drains of the FETs 21, 22, 23, respectively. Resistances R31, R32, R33 are connected between the sources and drains of the FETs 31, 32, 33, and resistances R41, R42, R43 are connected between the sources and drains of the FETs 41, 42, 43, respectively.

The remaining part of the switch circuit device in FIG. 5 is constructed in the same way as the switch circuit device in FIG. 1.

As well as the switch circuit device of the first embodiment, the switch circuit device of this embodiment provides high insertion loss and isolation and an improved input/output power characteristic.

Especially, since the switch circuit device of this embodiment uses the FETs 11 to 13, 21 to 23, 31 to 33, 41 to 43 connected in multiple stages, the voltage applied between the terminals A and B or the terminals A and C is distributed among FETs in an OFF state. Furthermore, since the resistances are connected between the sources and drains of the respective FETs, voltages applied between the gates and sources and the gates and drains of FETs in the OFF state are all equal. This further improves the withstand voltage characteristic of the FETs and also further improves the input/output power characteristic.

Figure 6:
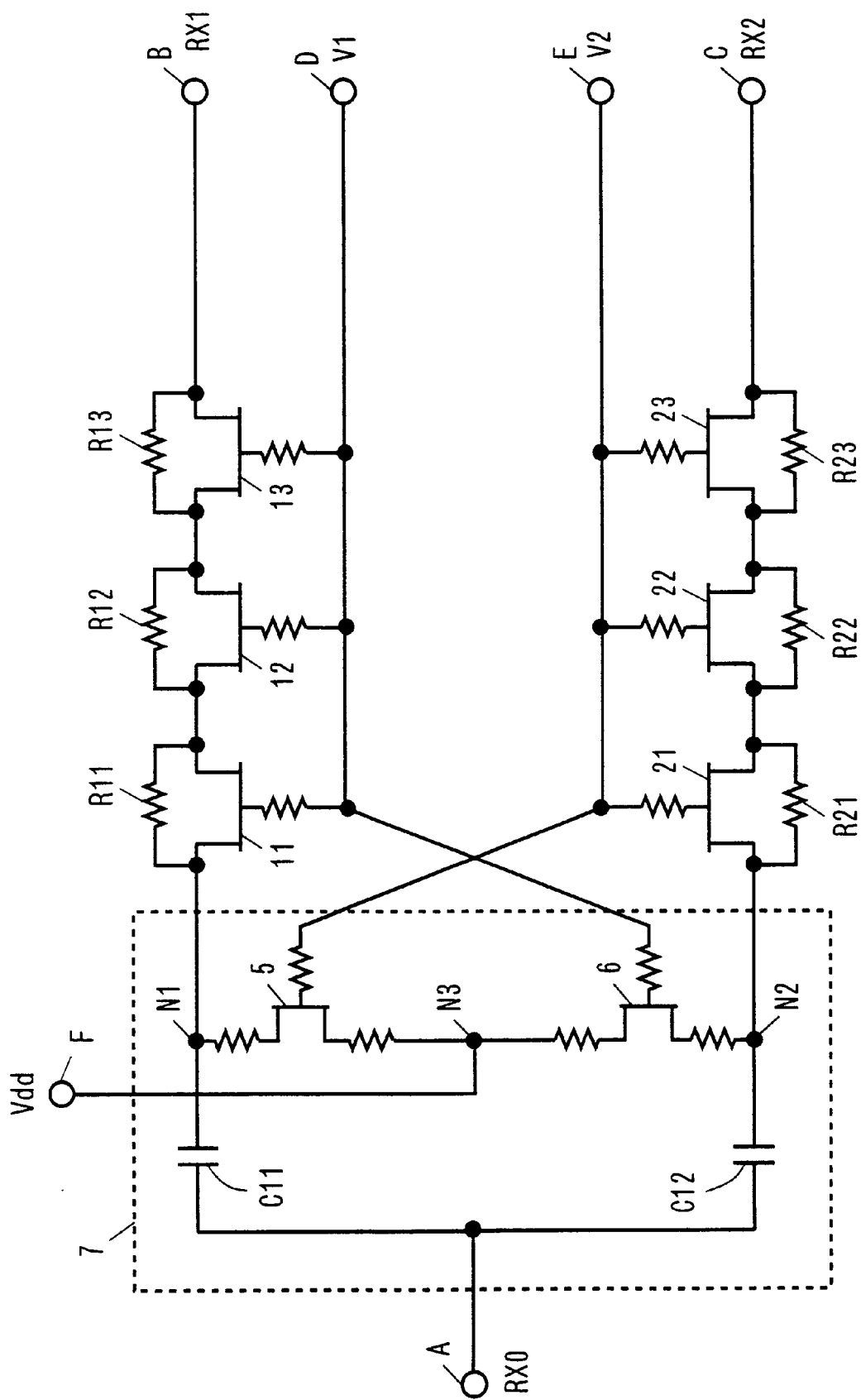
FIG. 6 is a circuit diagram showing a switch circuit device in a third embodiment of the present invention.

FIG. 6 is a circuit diagram showing a switch circuit device in a third embodiment of the present invention. The switch circuit device in FIG. 6 is different from that shown in FIG. 5 in that it does not have the FETs 31 to 33, 41 to 43, and the resistances R31 to R33, R41 to R43.

The switch circuit device shown in FIG. 6 is inferior to the switch circuit device in FIG. 5 in the respect of isolation. However, it uses a reduced number of FETs, which allows size reduction of the switch circuit device.

Figure 7:
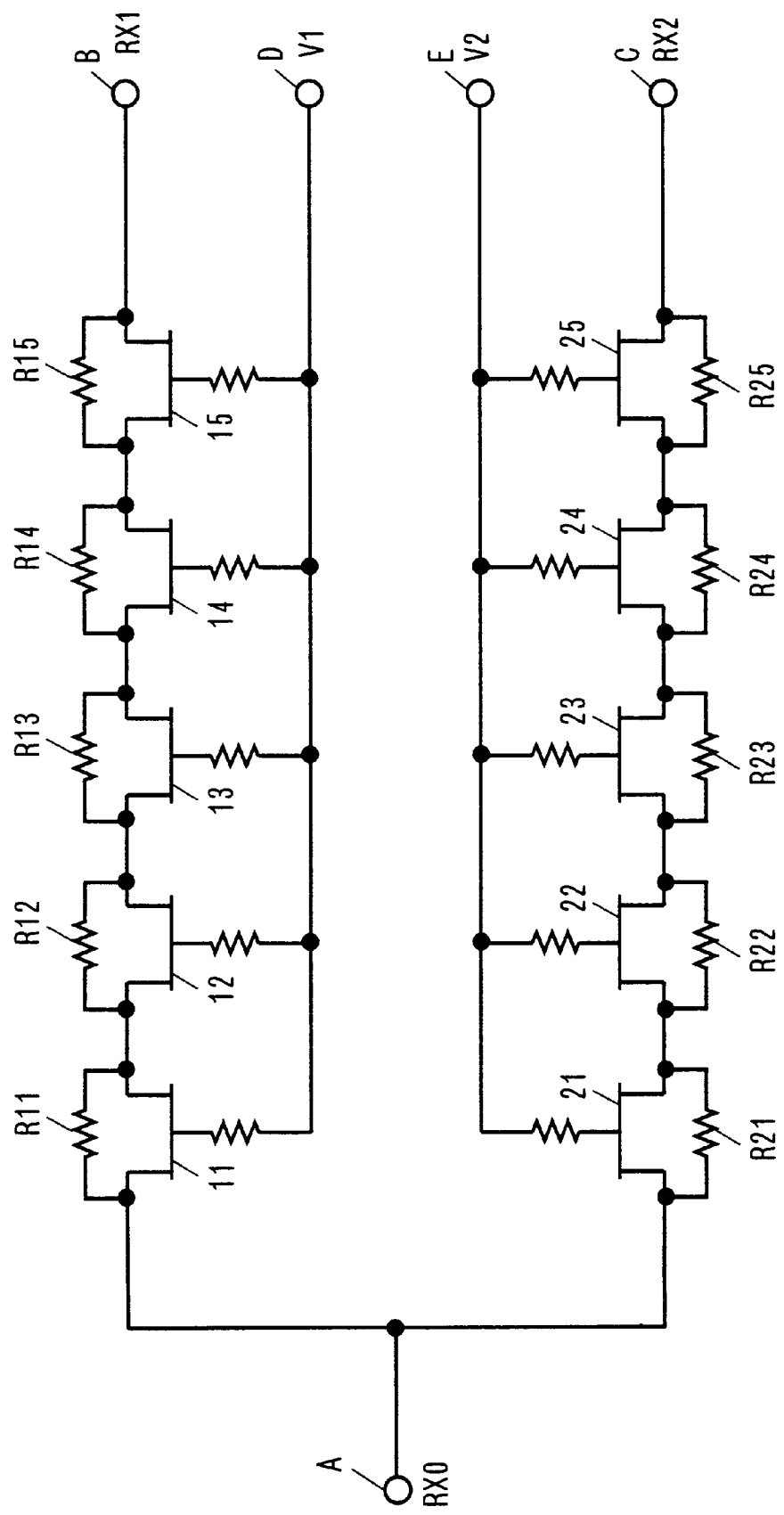
FIG. 7 is a circuit diagram showing a switch circuit device in a fourth embodiment of the present invention.

FIG. 7 is a circuit diagram showing a switch circuit device in a fourth embodiment of the present invention. In the switch circuit device shown in FIG. 7, five FETs 11 to 15 are connected in series between the terminals A and B and five FETs 21 to 25 are connected in series between the terminals A and C. The gates of the FETs 11 to 15 are connected to the control terminal D through respective resistances and the gates of the FETs 21 to 25 are connected to the control terminal E through respective resistances.

Resistances R11 to R15 are connected between the sources and drains of the respective FETs 11 to 15 and resistances R21 to R25 are connected between the sources and drains of the respective FETs 21 to 25.

The terminals A, B and C are supplied with high-frequency signals RX0, RX1, and RX2, respectively. The control terminals D and E are supplied with mutually complementary control voltages V1 and V2. In this embodiment, the control voltages V1 and V2 are +3.0 V or 0 V.

Since the switch circuit device of this embodiment includes the FETs connected in multiple stages, the voltage applied between the terminals A and B or the terminals A and C is distributed among OFF-state FETs. Furthermore, since each FET has a resistance connected between its source and drain, the voltages applied between the gates and sources and the gates and drains of OFF-state FETs are all equal. This improves the withstand voltage characteristic of the FETs and also improves the input/output power characteristic.

Figure 8:
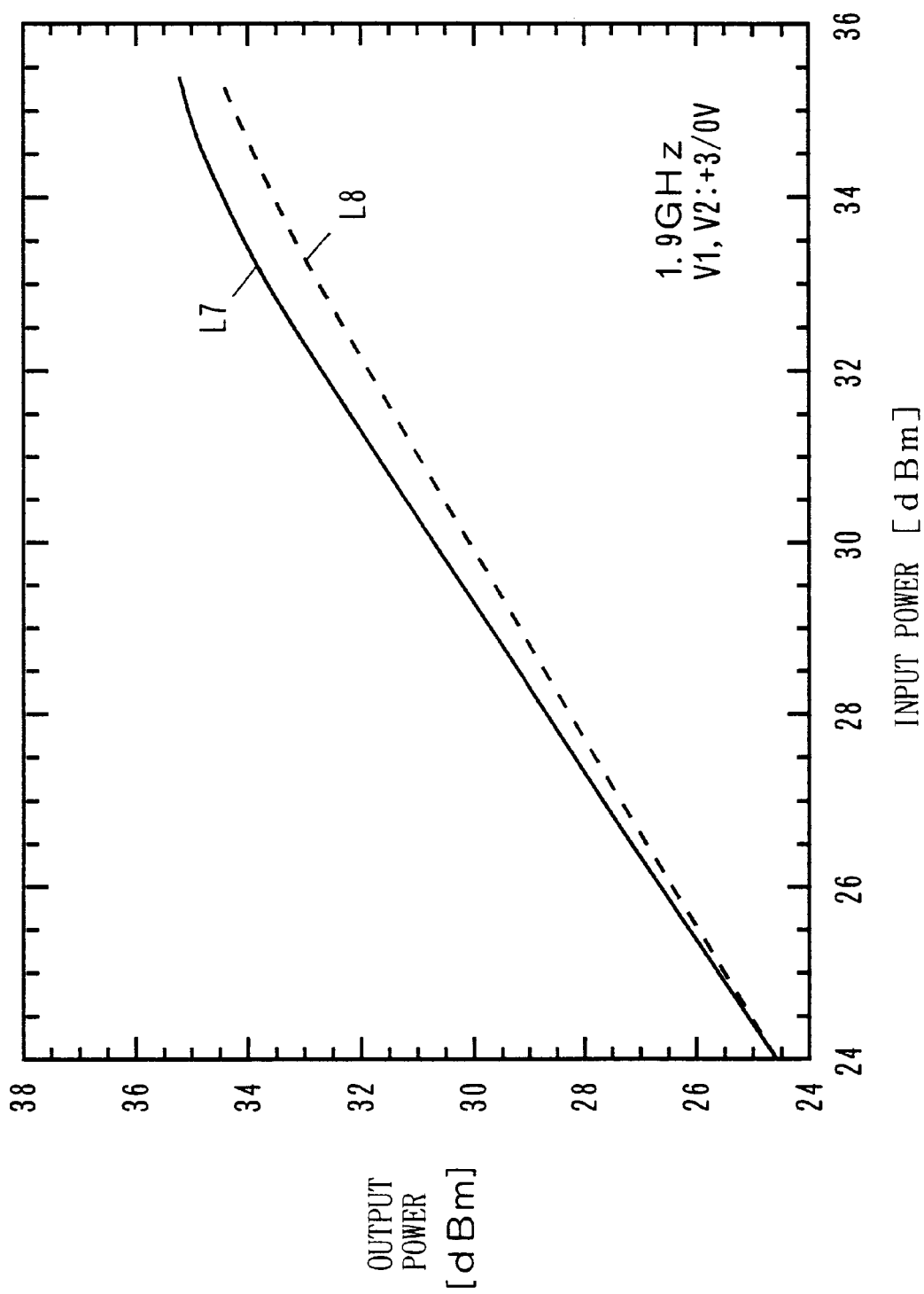
FIG. 8 is a diagram showing results of simulation for input/output power characteristic in the switch circuit device in FIG. 7 and the conventional switch circuit device in FIG. 14.
Figure 9:
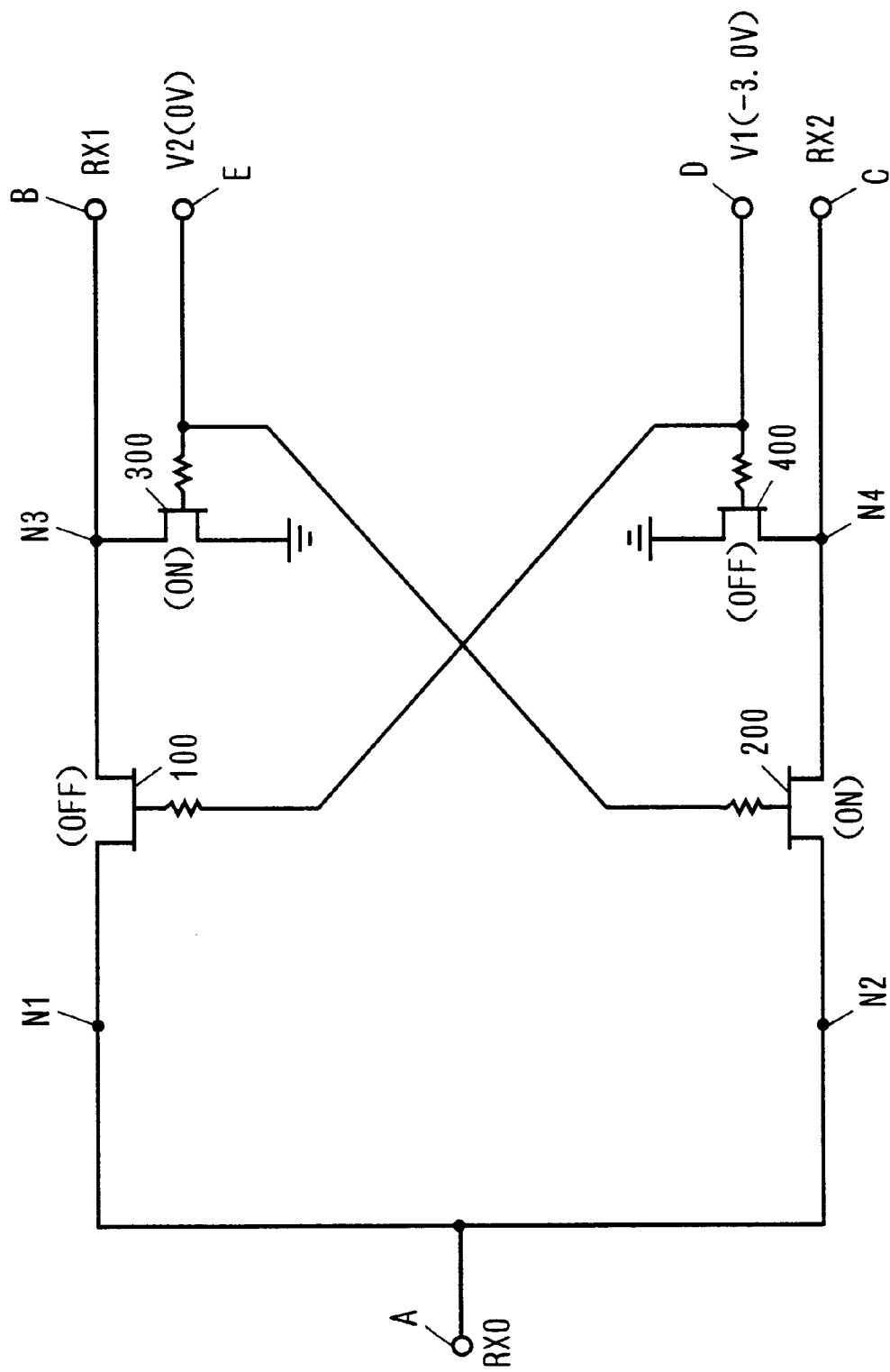
FIG. 9 is a circuit diagram showing an example of a conventional switch circuit device.
Figure 10:
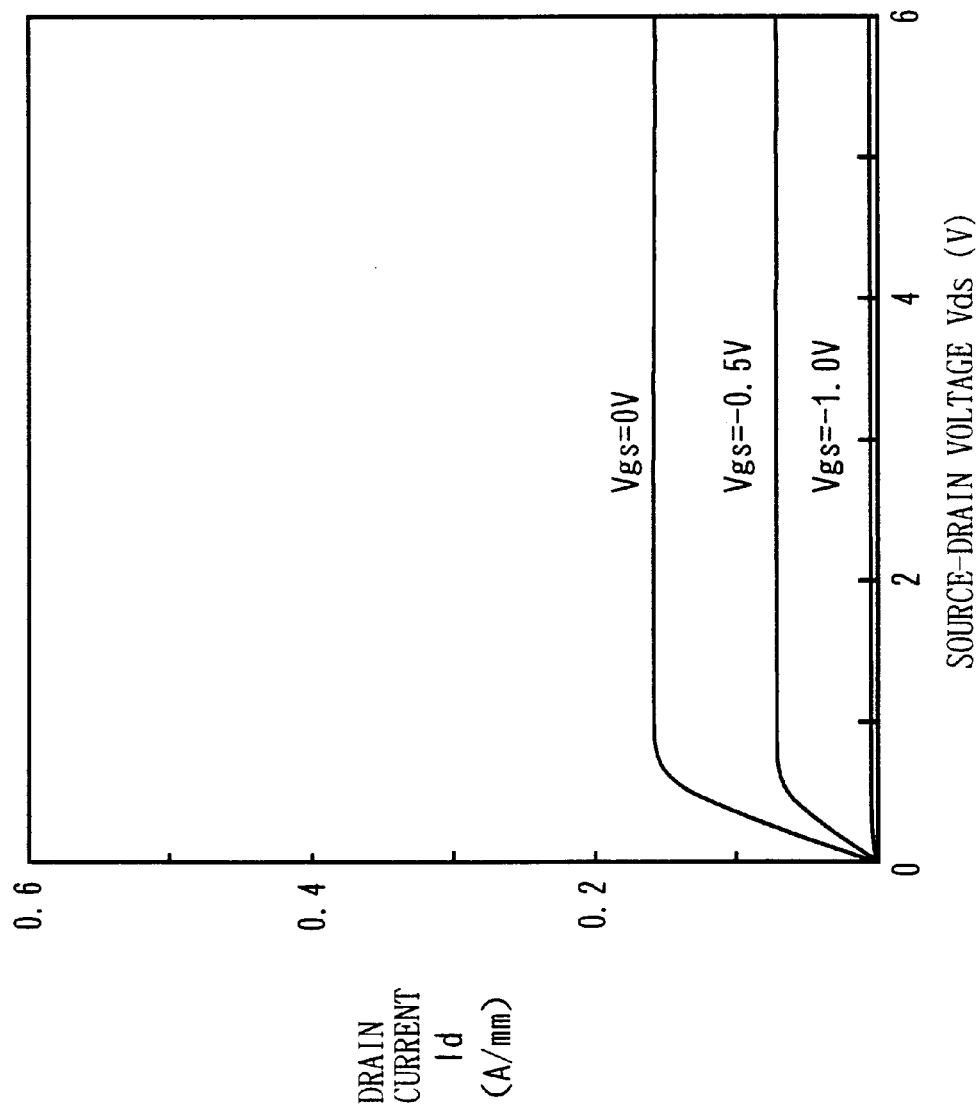
FIG. 10 is a diagram showing an example of drain current versus source-drain voltage characteristics of an FET.
Figure 14:
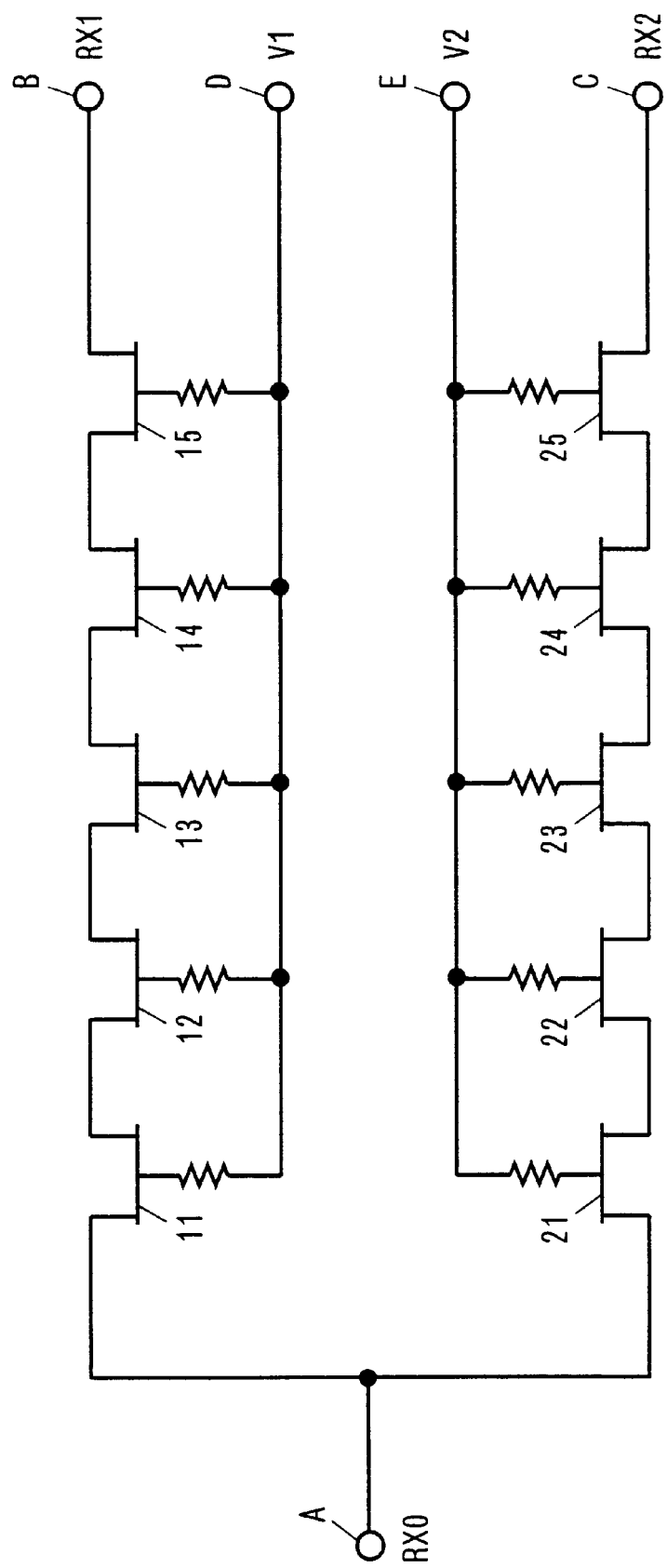
FIG. 14 is a circuit diagram showing another example of a conventional switch circuit device.

FIG. 8 shows results of simulation for the input/output power characteristic in the switch circuit device shown in FIG. 7 and the conventional switch circuit device shown in FIG. 14. In FIG. 8, the solid line L7 shows the input/output power characteristic in the switch circuit device in FIG. 7 and the broken line L8 shows the input/output power characteristic in the switch circuit device in FIG. 14. As shown in FIG. 8, the switch circuit device in FIG. 7 provides a superior input/output power characteristic as compared with the switch circuit device in FIG. 14.

While the invention has been described in detail, the foregoing description is in all aspects illustrative and not restrictive. It is understood that numerous other modifications and variations can be devised without departing from the scope of the invention.

We claim:

1. A switch circuit device that complementarily switches a path between a common terminal and a first terminal and a path between said common terminal and a second terminal to an ON state and an OFF state, comprising:

one or a plurality of first field-effect transistors connected in one stage or in a plurality of stages between a first node connected to said common terminal and said first terminal, and each having a gate electrode receiving a first control voltage, one electrode on the side of said first node and the other electrode on the side of said first terminal;

one or a plurality of second field-effect transistors connected in one stage or in a plurality of stages between a second node connected to said common terminal and said second terminal, and each having a gate electrode receiving a second control voltage complementary to said first control voltage, one electrode on the side of said second node and the other electrode on the side of said second terminal; and a switching circuit for applying a given pull-up voltage to one of said first and second nodes that is connected to a field-effect transistor in an OFF state and isolating from said pull-up voltage one of said first and second nodes that is connected to a field-effect transistor in an ON state.

2. The switch circuit device according to claim 1, wherein said switching circuit comprises, at least one third field-effect transistor connected between said first node and a first common node receiving said pull-up voltage and having a gate electrode receiving said second control voltage, and at least one fourth field-effect transistor connected between said second node and said first common node and having a gate electrode receiving said first control voltage.

3. The switch circuit device according to claim 2, wherein said first node is connected to said common terminal in an AC manner and said second node is connected to said common terminal in an AC manner.

4. The switch circuit device according to claim 3, wherein said switching circuit further comprises a first capacitor interposed between said common terminal and said first node, and a second capacitor interposed between said common terminal and said second node.

5. The switch circuit device according to claim 1, further comprising one or a plurality of fifth field-effect transistors connected in one stage or in a plurality of stages between said first terminal and a ground potential and each having a gate electrode receiving said second control voltage, one electrode on the side of the ground potential and the other electrode on the side of said first terminal, and one or a plurality of sixth field-effect transistors connected in one stage or in a plurality of stages between said second terminal and the ground potential and each having a gate electrode receiving said first control voltage, one electrode on the side of the ground potential and the other electrode on the side of said second terminal.

6. The switch circuit device according to claim 5, wherein said one or plurality of fifth field-effect transistors are connected between said first terminal and a second common node, and said one or plurality of sixth field-effect transistors are connected between said second terminal and said second common node, and wherein said second common node is connected to the ground potential in an AC manner and receives said pull-up voltage.

7. The switch circuit device according to claim 6, further comprising a third capacitor connected between said second common node and the ground potential.

8. The switch circuit device according to claim 1, wherein said first and second control voltages complementarily change to the ground potential and a positive potential and said pull-up voltage is kept at a positive potential.

9. The switch circuit device according to claim 8, wherein said positive potential of said first and second control voltages is approximately equal to said positive potential of said pull-up voltage.

10. The switch circuit device according to claim 1, wherein said one or plurality of first field-effect transistors comprise a plurality of first field-effect transistors, and said one or plurality of second field-effect transistors comprise a plurality of second field-effect transistors, and wherein said switch circuit device further comprises a plurality of first resestances each connected between said one ilectrode and said other electrode of a corresponding one of said plurality of first field-effect trandsistor, and a plurality of second resistances each connected between said one electrode and said other electrode of a corresponding one of said plurality of second field-effect transistors.

11. The switch circuit device according to claim 6, wherein
    said one or plurality of fifth field-effect transistors comprise a plurality of fifth field-effect transistors, and
    said one or plurality of sixth field-effect transistors comprise a plurality of sixth field-effect transistors,
    and wherein said switch circuit device further comprises a plurality of third resistances each connected between said one electrode and said other electrode of a corresponding one of said plurality of fifth field-effect transistors, and
    a plurality of fourth resistances each connected between said one electrode and said other electrode of a corresponding one of said plurality of sixth field-effect transistors.

12. The switch circuit device according to claim 1, wherein said one or plurality of first field-effect transistors and said one or plurality of second field-effect transistors are metal semiconductor field-effect transistors.

13. The switch circuit device according to claim 2, wherein said one or plurality of first field-effect transistors, said one or plurality of second field-effect transistors, said one or plurality of third field-effect transistors, and said one or plurality of fourth field-effect transistors are metal semiconductor field-effect transistors.

14. The switch circuit device according to claim 5, wherein said one or plurality of first field-effect transistors, said one or plurality of second field-effect transistors, said one or plurality of fifth field-effect transistors, and said one or plurality of sixth field-effect transistors are metal semiconductor field-effect transistors.

15. A switch circuit device that complementarily switches a path between a common terminal and a first terminal and a path between said common terminal and a second terminal to an ON state and an OFF state, comprising:

a plurality of first field-effect transistors connected in a plurality of stages between said common terminal and said first terminal, and each having a gate electrode receiving a first control voltage, one electrode on the side of said common terminal, and the other electrode on the side of said first terminal;

a plurality of second field-effect transistors connected in a plurality of stages between said common terminal and said second terminal, and each having a gate electrode receiving a second control voltage complementary to said first control voltage, one electrode on the side of said common terminal, and the other electrode on the side of said second terminal;

a plurality of first resistances each connected between said one electrode and said other electrode of a corresponding one of said plurality of first field-effect transistors; and a plurality of second resistances each connected between said one electrode and said other electrode of a corresponding one of said plurality of second field-effect transistors.

16. The switch circuit device according to claim 15, wherein said first and second control voltages complementarily change to a ground potential and a positive potential.

17. The switch circuit device according to claim 15, wherein said plurality of first field-effect transistors and said plurality of second field-effect transistors are metal semiconductor field-effect transistors.

* * * * *